United States Patent
Fujikawa et al.

(10) Patent No.: US 6,451,682 B1
(45) Date of Patent: Sep. 17, 2002

(54) METHOD OF FORMING INTERCONNECT FILM

(75) Inventors: Takao Fujikawa, Takasago (JP); Makoto Kadoguchi, Takasako (JP); Kohei Suzuki, Kobe (JP); Yasushi Mizusawa, Susono (JP); Tomoyasu Kondou, Susono (JP); Yoji Taguchi, Susono (JP)

(73) Assignee: Ulvac, Inc., Chigasaki (JP)

( * ) Notice: Subject to any disclaimer, the term of this patent is extended or adjusted under 35 U.S.C. 154(b) by 0 days.

(21) Appl. No.: 09/429,109

(22) Filed: Oct. 28, 1999

(30) Foreign Application Priority Data

Nov. 2, 1998 (JP) .......................... 10-312443
Mar. 10, 1999 (JP) .......................... 11-063921

(51) Int. Cl.[7] .......................... H01L 21/4763
(52) U.S. Cl. .......................... 438/618
(58) Field of Search .......................... 438/618, 627, 438/637, 638, 633, 658, 723, 784, 795; 257/760, 759

(56) References Cited

U.S. PATENT DOCUMENTS

| 5,219,790 A | 6/1993 | Miyatake |
| 5,895,274 A | 4/1999 | Lane et al. |
| 6,002,175 A | 12/1999 | Maekawa |
| 6,017,144 A | * 1/2000 | Guo et al. .......... 438/618 |
| 6,043,149 A | 3/2000 | Jun |

FOREIGN PATENT DOCUMENTS

| DE | 196 14 331 | 4/1997 |
| DE | 197 52 637 | 7/1998 |
| EP | 0 731 503 | 9/1996 |
| EP | 0 982 771 | 3/2000 |
| WO | WO 98/27585 | 6/1998 |

* cited by examiner

Primary Examiner—Howard Weiss
Assistant Examiner—(Vikki) Hoa B. Trinh
(74) Attorney, Agent, or Firm—Oblon, Spivak, McClelland, Maier & Neustadt, P.C.

(57) ABSTRACT

This invention provides a filming method for covering the surface of the insulating film of a semiconductor substrate with a copper interconnect film free from pores.

The surface of the insulating film 2 of a semiconductor substrate 1 is filmed with a copper or copper alloy 3 by any one of plating, CVD and PVD, and the whole body is then heated under a high-pressure gas atmosphere to cover the surface with an interconnect film 4 free from pores.

11 Claims, 3 Drawing Sheets

ATMOSPHERIC PRESSURE THERMAL TREATMENT (COMPARATIVE EXAMPLE)

HIGH-PRESSURE GAS TREATMENT (THIS INVENTION)

FIG. 3a COMPARATIVE EXAMPLE

FIG. 3c THIS INVENTION

METHOD OF FORMING INTERCONNECT FILM

BACKGROUND OF THE INVENTION

1. Field of the Invention

This invention relates to the formation of an interconnect film in the manufacturing process of a semiconductor represented by ultra large scale integrated circuit (ULSI) and, particularly, a method for filling the hole of a connecting part or an interconnect groove with an interconnect film material and providing satisfactory adhesion by forming a copper or copper alloy interconnect material film by any one of plating, chemical vapor deposition (CVD), and physical vapor deposition (PVD), and further treating it under a high-pressure, high-temperature gas atmosphere.

2. Description of the Prior Art

Japanese Patent No. 2660040 (registered: Jun. 6, 1997) discloses "a vacuum filming method which comprises steps of forming a metal thin film on a substrate having a recessed part by a vacuum thin film forming method such as sputtering, CVD, vacuum evaporation or the like; heating the whole metal thin film formed on the substrate to fluidize it; and pressurizing the metal of the fluidized metal thin film by a gas to fill the recessed part with the metal of the metal thin film in such a manner that no cavity is produced within the recessed part" (Prior Art 1).

Japanese Patent Application Laid-Open No. 7-193063 discloses "a method for processing an article having a surface, the surface having at least one recessed part within the surface, which comprises forming a layer on at least a part of the surface so that the layer is extended above the recessed part, and exposing the article and the layer to a high pressure and high temperature sufficient to deform a part of the layer so as to fill the recessed part" (Prior Art 2).

It is described in this known data that the article consists of a semiconductor wafer, the recessed part consists of a hole, groove or via formed on the semiconductor wafer, and the layer consists of a metal such as aluminum. It is also disclosed that a gas is usable for pressurization at a temperature of 350–650° C. and a pressure of 3,000 psi or more when the layer is aluminum, and it is necessary to set the thickness of the layer formed on the hole or groove equal to at least the width of the hole. Further, it is also described that the semiconductor itself, even if a plurality of layers having different characteristics are included therein, can be manufactured as the result of a manufacturing process including a plurality of steps in order to form it.

As the method for filling the cavity formed in the hole or groove mainly in order to improve the conductivity of the semiconductor interconnect film, it is shown in these prior arts that the crush or inflow by a high pressure at a high temperature is effective. However, the Al interconnect films shown in these known data have reached the limit in respect to EM resistance (Electron Migration) and reduction in electric resistance which are required as the connecting material according to the future fining of ULSI. Although expectations are recently placed on Cu which is regarded to be superior to Al in these respects, the equal result can not be obtained even if the above prior arts 1 and 2 are applied thereto in the same manner, since the filming condition and the texture of the film after deposition are largely differed from those of Al.

As a result of experimental examinations on the application of these prior arts mainly to a copper interconnect film, the prevent inventors found that there were further several problems in the application to industrial production.

The first problem is that a filming material must be laid in the state where it perfectly covers the hole or groove at the time of film deposition in order to form a texture having no pore in the hole or groove part by high pressure filling treatment. Although sputtering is conventionally used for the formation of an Al or Al—Cu alloy interconnect film, it is hardly used for the copper interconnect film because of the difficulty of line formation by etching process which is the after process. Attention is given to wet plating (electroplating or electroless plating) for the copper interconnect film. The wet plating has a problem of the necessity of new construction of a plating equipment and another factory, while the sputtering is suitable to reduce the equipment cost since most ULSI makers already hold the equipment therefor.

The present inventors proposed a method for providing a sound interconnect structure by forming a copper interconnect film by this sputtering method, and extinguishing pores formed under it by a treatment under high-pressure gas atmosphere (Japanese Patent Application Nos. 10-63439, 10-91651, and 10-113649), but it is the actual state that this method has the following subjects.

Namely, since the texture or property of the formed film is largely changed depending on how to set the film deposition condition in the sputtering, the setting of the film deposition condition is extremely important, and the temperature of a film deposition also has a great influence on the properties of the formed film. The condition of sputtering for efficiently blocking the hole or groove is that a substrate is heated to 300° C. or higher. In this case, however, a phenomenon of growing the crystal grain size up to about several microns occurs although the opening part of the hole or groove is filled.

When the hole diameter is small as 0.25 $\mu$m or less in a thus-formed copper interconnect film (purity: 99.99% or more), the state as a monocrystal is put on the hole part is formed. A pressure filling by plastic deformation phenomenon is necessary to extinguish the pores of the copper or copper alloy material in this state, which brings about a problem of the necessity of a pressure of 100 MPa or more even at a temperature of 450° C. One of the causes thereof is that the crystal structure of the copper film consists large copper crystal grains and has strong orientation (111) to the substrate surface.

The pressurizing treatment at such a high temperature is a significant subject in respect to the combination of the lower electric resistance and an insulating film having a low dielectric constant for the higher treatment speed of a semiconductor device in the future. Namely, as the low dielectric constant insulating film material, a heat resisting resin material has been regarded as a promising candidate, and its development has been progressed. However, its heat resisting temperature is only about 400° C., and the temperature in the pressurizing treatment is set to 400° C. or lower and, preferably, 380° C. or lower.

SUMMARY OF THE INVENTION

This invention thus has an object to provide a method of forming an interconnect film in which pores of a copper or copper alloy interconnect film formed by use of any one of plating, CVD, and PVD can be extinguished with the lowest pressure possible.

This invention provides a method of forming an interconnect film by covering the surface of the insulating film of a substrate having the insulating film having a hole or groove formed thereon with a copper or copper alloy metallic material, thereby filling the hole or groove inner part with the metal material, and the following technical means are adapted.

Namely, a method of forming an interconnect film of this invention according to the first invention comprises precipitating a metallic material of copper or copper alloy consisting of crystal grains in the hole or groove inner part and on the surface of a barrier layer on an insulating film or a seed layer formed on the barrier layer by means of plating or CVD, and then heating the whole body under a high-pressure gas atmosphere to progress the crystal grain growth of the crystal grains in the metallic material while suppressing generation of pores, thereby covering the whole surface of the substrate and the hole or groove inner part with the metallic material film substantially free from pores.

A method of forming an interconnect film of this invention according to the second invention comprises precipitating a metallic material of copper or copper alloy consisting of crystal grains in the hole or groove inner part and on the surface of a barrier layer on an insulating film or a seed layer formed on the barrier layer by means of PVD, and then heating the whole body including the substrate under a high-pressure gas atmosphere to progress the crystal grain growth of the crystal grains in the metallic material while suppressing generation of pores, thereby covering the whole surface of the substrate and the hole or groove inner part with the metallic material film substantially free from pores.

A method of forming an interconnect film of this invention according to the third invention comprises forming a barrier layer on the insulating film by means of CVD or PVD, exposing the resulting substrate to a high-temperature, high-pressure gas atmosphere to closely fit the barrier layer to the insulating film, precipitating the metallic material of copper or copper alloy consisting of crystal grains in the hole or groove inner part and on the surface of the barrier layer on the insulating film or a seed layer formed on the barrier layer, and then heating the whole body under a high-pressure gas atmosphere to progress the crystal grain growth of the crystal grains in the metallic material while suppressing generation of pores, thereby covering the whole surface of the substrate and the hole or groove inner part with the metallic material film substantially free from pores.

A method of forming an interconnect film of this invention according to the fourth invention comprises forming a barrier layer on the insulating film by means of CVD or PVD, exposing the substrate to a high-temperature, high-pressure gas atmosphere to closely fit the barrier layer to the insulating film, precipitating the metallic material of copper or copper alloy consisting of crystal grains in the hole or groove inner part and on the surface of the barrier layer on the insulating film or a seed layer formed on the barrier layer by any one of plating, CVD and PVD, and then heating the whole body under a high-pressure gas atmosphere after adding hydrogen to the metallic material film to progress the crystal grain growth of the crystal grains in the metallic material while suppressing generation of pores, thereby covering the whole surface of the substrate and the hole or groove inner part with the metallic material film substantially free from pores.

The "substrate" referred herein means a Si substrate (semiconductor substrate), the "plating" means wet plating, and the "seed layer" means a copper seed layer.

In this invention, it is advantageous to precipitate the crystal grains of the metallic material on the seed layer surface by means of electroplating after forming the seed layer on the barrier layer by means of CVD or sputtering.

Namely, since a $SiO_2$ insulating film layer is formed on the Si substrate, the electroplating can not be applied thereto as it is. Therefore, a bed film (seed layer) is necessary, and the same material is naturally used therefor. For the formation of this seed layer, electroless plating may be adapted, but CVD and sputtering are recommended from the viewpoint of contamination prevention and film thickness controllability.

In the structures of this invention, the metallic material desirably consists of fine crystal grains having average crystal grain sizes of 0.1 $\mu$m or less.

By setting the crystal grain size to 0.1 $\mu$m or less, revelation of superplastic phenomenon becomes remarkable, and the non-poring at the lower pressure and the lower temperature can be attained.

BRIEF DESCRIPTION OF THE DRAWINGS

FIGS. 1a, 1b and 1c show typical views of the prior application technique, wherein FIG. 1a shows a texture by sputtering filming, and FIGS. 1b and 1c show textures by a filling treatment under a high-temperature, high-pressure gas atmosphere.

FIGS. 2a, 2b and 2c show typical views of textures according to this invention and a comparative example, wherein FIG. 2a shows a texture by filming by any one of CVD, plating and PVD, FIG. 2b shows a texture according to the comparative example (filling by atmospheric pressure thermal treatment), and FIG. 2c shows a texture according to this invention.

FIGS. 3a, 3b and 3c show typical views of textures according to this invention and a comparative example, wherein FIG. 3a shows a texture by filming by any one of CVD, plating and PVD, FIG. 3b shows a texture according to the comparative example, and FIG. 3c shows a texture according to this invention.

DESCRIPTION OF THE PREFERRED EMBODIMENTS

The structure and effect of this invention will be described in comparison with the filming means related to the earlier invention (Japanese Patent Application No. 10-63439) and comparative examples with reference to the drawings.

The present inventors performed experiments on the filling treatment in high-temperature, high-pressure gas atmosphere of a copper interconnect film formed by sputtering (Japanese Patent Application No. 10-63439), and obtained the following knowledge.

Figure 1A:
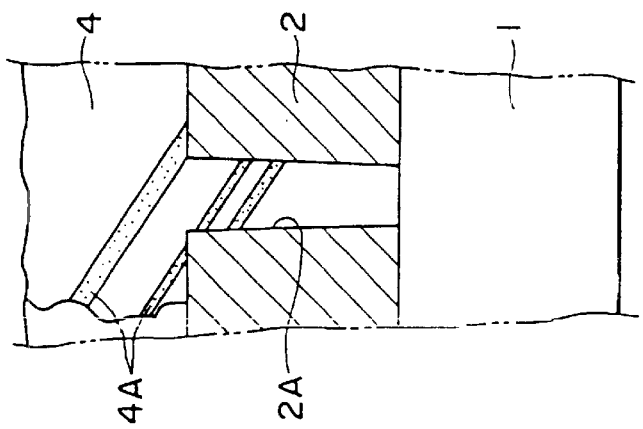
Figure 1B:
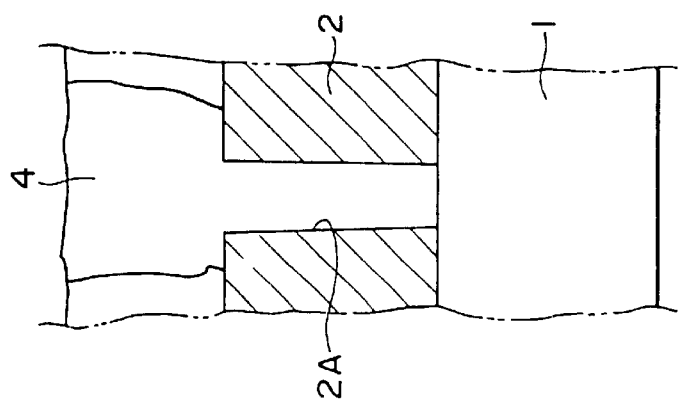
Figure 1C:
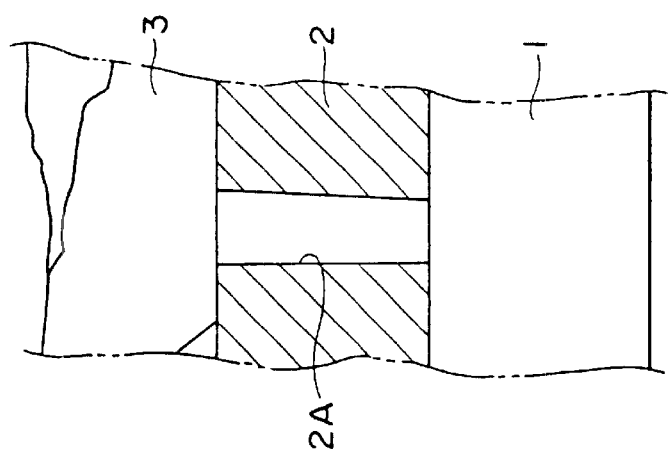

The state of a pure copper film formed by such a method shows a texture as shown in FIG. 1a. In FIG. 1a, denoted at 1 is a semiconductor substrate shown by a Si wafer, 2 is an oxidized insulating film having a hole or groove 2A formed thereon ($SiO_2$ insulating film), 3 is an interconnect film consisting of Cu crystal grains, which is formed by sputtering and consists of rather large crystal grains as is apparent from FIG. 1a. When a film having such a texture is subjected to a filling treatment under a high-temperature, high-pressure gas atmosphere of 450° C., 100 MPa or more from the above limitation in temperature, an interconnect film 4 in which the filling treatment to a hole 2A was performed in the states as shown in FIG. 1b and 1c was formed. When the pressure is raised as 200 MPa, a texture including twins 4A as shown in FIG. 1c is observed in various places according to the stress release in a pressure reducing process after the filling by plastic flow. Since a so-called grain boundary is not generated within a contact hole in any case, the copper interconnect film 4 has an extremely low electric resistance.

Although it is extremely preferred to fill the inner part of the hole 2A with the monocrystal in this way from the viewpoint of the lower electric resistance, the pressure filling treatment under high-temperature, high-pressure gas atmosphere requires a pressure of 100 MPa or more at a low temperature of 450° C. or lower, and a pressure of 150 MPa or more when the diameter of the hole 2A is small as 0.13 $\mu$m. The requirement of the high pressure brings about an important problem in the application to production process in that the device used for the pressure filling treatment is extremely large-scaled.

The present inventors examined the filling by diffusion reflow of an opened groove with the interconnect film material simultaneously with the means for reducing the pressure in the pressure filling treatment. At a result, it was found that it is one of the solving means to utilize a filming technique capable of precipitating the finest crystal grains possible or a so-called superplastic deformation phenomenon by fining of crystal grains, and to enlarge the crystal grains while suppressing generation of pores which is apt to occur at the time of crystal grain growth in heating by a high-pressure gas pressure, consequently forming a film of a texture consisting of large crystal grains. Further, it was found that it is necessary for this that the texture of the copper interconnect film after formation consists of not large crystal grains as in FIG. 1a but the finest ones possible, and it is advantageous to hold the temperature of the semiconductor substrate low in the filming by PVD and reduce the input power in sputtering. On the basis of our knowledge, CVD, plating and PVD were examined as filming means.

FIG. 2 show typical views of textures by filming by CVD or wet plating and PVD, wherein denoted at 2B is a barrier layer in the hole or groove 2A and on an insulating film 2, and common reference marks are employed for others common to FIG. 1.

Figure 2A:
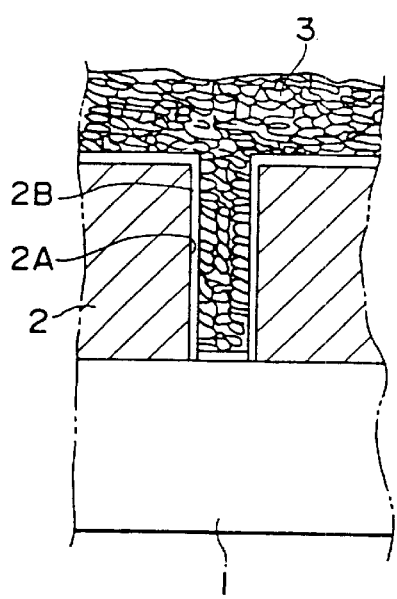
Figure 2B:
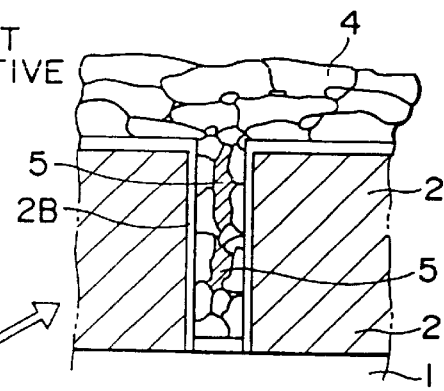
Figure 2C:
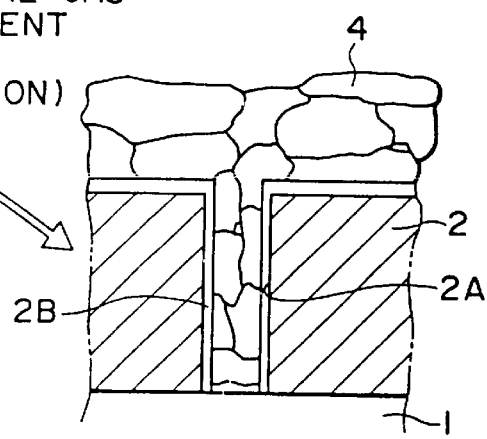

FIG. 2 typically shows a comparative example [FIG. 2b] showing a copper interconnect film texture 4 obtained by heating a polycrystal copper film 3 having such fine crystal grains as shown in FIG. 2a under atmospheric pressure (or vacuum), and this invention [FIG. 2c] which shows the copper interconnect texture 4 obtained by heating under a high-pressure gas atmosphere. The finer pores are interposed between fine copper crystal grains of FIG. 2a. The copper crystal grains are developed when heated under atmospheric pressure or vacuum, and some of the above-mentioned pores are aggregated at this time to form a large pore 5. When the barrier film material is highly affinitive with copper, the pore 5 formed by aggregation is apt to generate in the central part of the hole or groove or the part near the inlet of the hole. When the affinity of the barrier film material with copper is poor, on the other hand, the pores are aggregated in the bottom part of the hole or groove to form a large cavity because only the copper crystal grains are mutually collected.

In FIG. 2, the diameter or width of the actual hole or groove 2A is 0.5 $\mu$m or less and, recently, in the order of 0.2 $\mu$m or less. Thus, the crystal grain size such that the effect of crystal grain growth is exhibited as described above is within the area of 0.1 $\mu$m or less as is apparent from the illustration in FIGS. 1 and 2. The crystal grain size of 0.1 $\mu$m is the grain size where the crystal grains further smaller than it are grown by annealing when allowed to stand at room temperature after plating in the filming by plating, and stopped to grow. This is another condition for the application of this invention.

A film consisting of crystal grains of this degree can be formed also by means of PVD when the temperature of the substrate 1 is kept at about room temperature. However, since the substrate temperature is raised by the heat generated in PVD, the dimension tends to be increased as the treatment time of PVD is extended, or in the grains adhered later. To prevent this, it is also recommended to cool the substrate in the filming. In contrast to this, it is general to control the substrate temperature in CVD. In plating, the temperature in filming is room temperature or several 10° C. or lower at the highest, which is suitable to provide a film consisting of extremely small crystal grains.

In the above illustration in reference to FIG. 2, it is particularly effective to fill the hole with the copper interconnect film by pressure filling by utilizing also the superplastic phenomenon. In this case, it is necessary to lay the open parts of the hole or groove in the perfectly blocked state by the interconnect film material. By forming such a state, the upper copper interconnect film material is plastically deformed in the form of simple extrusion phenomenon, and extruded into the hole or groove to fill the cavity parts.

Since the extrusion deformation at the lower pressure or the lower temperature can be performed by the revelation of the superplastic phenomenon as the crystal grains of the copper interconnect film material are finer, the crystal grains are desirably fine. In case of plating, the crystal grains can be easily made fine by increasing the precipitating speed since the plating is performed at about room temperature, and a film having an average crystal grain size of 5–50 nm can be also formed. However, it is not advisable to perform the precipitation at an extremely high speed since the entwining phenomenon of electrolyte is caused when the precipitating speed is too high. The thus-entwined electrolyte is expanded, in general plating, in the form as it foams in the thermal treatment under vacuum or atmospheric pressure(350–400° C.) after filming to generate spherical bubbles in the interconnect film, causing the pores as in FIG. 2b showing the comparative example. Since the thermal treatment is performed under a high pressure in this invention, a part of the entwined electrolyte can be dispersed without generating bubbles [FIG. 2c].

According to CVD, further, the finer grains relatively uniformed in grain size can be precipitated. In the CVD, the gas of hydrocarbon and water generated according to the thermal decomposition of Cu(hfac)$_2$ (copper hexafluoroacetyl acetonite) used as source or the carrier gas Ar is entwined, but the generation of pores resulted from this can be suppressed according to this invention.

It is known that the diffusion phenomenon of the interconnect film atom has a great influence particularly on the crystal grain growth. The present inventors found that the crystal grain growth free from pores under a high pressure, when the copper interconnect film is formed by plating, is progressed at a lower temperature than in the formation by general PVD with the same pressure. Further, as a result of inspections for the textures and compositions of the both, it was found that the Cu interconnect film formed by plating not only has a small crystal grain size but also contains 2–5 wt. % of hydrogen, and the presence of hydrogen promotes the diffusion phenomenon of copper atom, resulting in the crystal grain growth at a low temperature. On the basis of this, addition of hydrogen to the copper interconnect film formed by PVD was attempted. Consequently, it was confirmed that the crystal grain growth and the filling can be performed at a low temperature of 300–350° C. even under a pressure of about 100 MPa. To add hydrogen, a hydrogen furnace (temperature: 100–300° C.) of substantially atmospheric pressure was used, but other methods such as injection of hydrogen ion, treatments under hydrogen plasma atmosphere and under pressure reduced atmosphere, or the like, if the addition of hydrogen is possible, can be used without limitation. However, in the combination with an organic insulating film having a low dielectric constant, a method capable of adding hydrogen at the lowest temperature possible is recommended since the organic insulating film itself causes a thermal decomposition reaction by the hydrogen addition when the temperature is raised to 300° C. or higher.

Figure 3B:
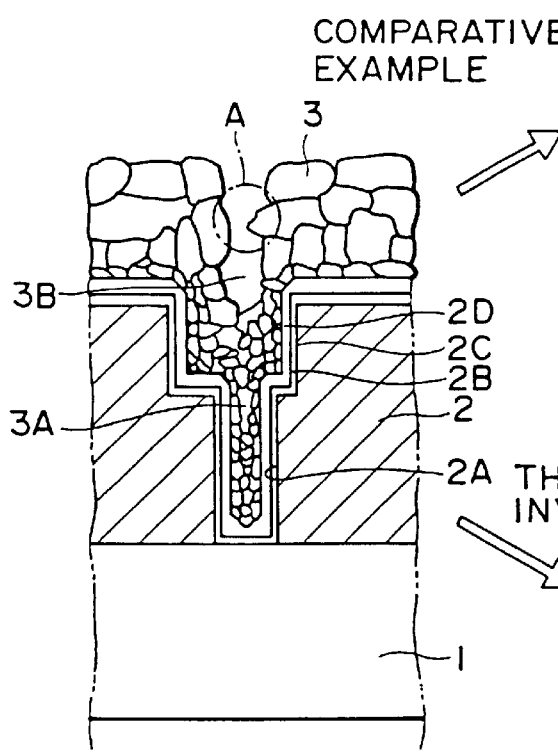

On the other hand, when the opening parts of the hole or groove are not perfectly blocked, only the diffusion phenomenon is utilized to fill the hole or groove with the copper interconnect film material. In this case, the filling state of the cavity by the diffusion phenomenon is changed according to the kind of the barrier layer provided in the lower part or the way to adhere the seed layer, and the structure particularly apt to be laid in such a state is a so-called dual Damascene structure, wherein holes are formed in some places of the lower part of the groove. Examples of the dual Damascene structure are typically shown in FIG. 3.

Figure 3B:
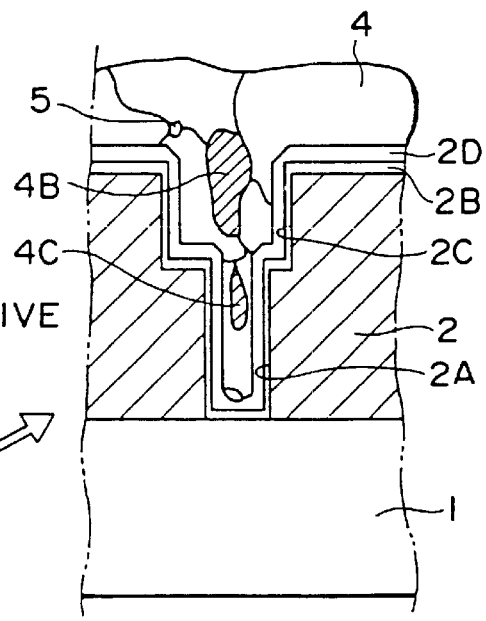
Figure 3B:
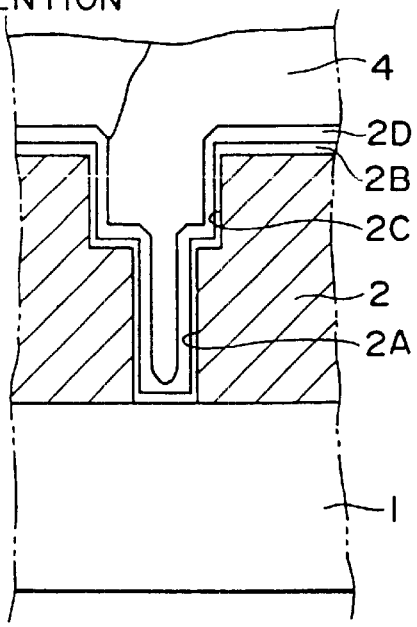

In one example of the so-called Damascene structure in FIG. 3, a barrier layer 2B is adhered to the inner surface of a hole part 2A and a groove part 2C, a fine and minute copper seed layer 2D is formed by CVD, and copper is thickly adhered by plating after relatively fine copper crystal grains are further precipitated by CVD. In the other example of the Damascene structure in FIG. 3, the barrier layer 2B is adhered to the inner surfaces of the hole part 2A and the groove part 2C, and fine copper grains are precipitated at a low temperature by means of PVD. In both the cases, a pore 3A is generated in the slightly lower part of the part where the hole part 2A is transferred to the groove 2C, and a groove 3B opened upward is left as it is.

When the whole body of the substrate 1 having the copper interconnect film 3 in such a state is heated (350–450° C.) under atmospheric pressure (comparative example), fine crystal grains are grown. At this time, the part A having a small space is adhered and bonded to generate a cavity 4B under it. The pore 3A left in the lower part is left as it is or in the form of a slightly larger pore 4C [referred to FIG. 3b].

On the other hand, when the thermal treatment (350–450° C.) is performed under a high-temperature, high-pressure atmosphere, the pores left in the hole part are crushed and extinguished by the growth of the crystal grains and the pressure since the pores are in closed state. In the upper groove 3B, the grains are grown in the form as large crystal grains absorb small crystal grains. At this time, the crystal grain surface exposed to the high-pressure gas is vigorously stroke by the pressure medium of the high-pressure gas atom, the surface diffusion is consequently promoted 30–50 times to bond the grains in the direction of minimizing the surface area. At a result, the part opened upward is finally pushed upward and flattened. Thus, the lower pores are crushed, and the upper opening is flattened by a so-called high-pressure reflow phenomenon by the promotion of the surface diffusion phenomenon, and reformed into an interconnect film free from pores. As is apparent from FIG. 3c, the final crystal grain form becomes large by the promotion of the diffusion phenomenon under a high pressure as in this invention, and the electric resistance is minimized, so that a satisfactory texture as interconnect film can be realized.

The left pores can be reduced by performing a thermal treatment under high-pressure gas atmosphere after the thermal treatment under atmospheric pressure. In this case, the crystal grains of copper which is the interconnect material were coarsened already, and the pores are frequently laid in the state where they are taken into a coarsened monocrystal. To extinguish such pores, it is required to set the pressure to a high pressure as 150 MPa or more as described above or further raise the temperature. Such a high pressure requires a large-scaled equipment and such a temperature rise causes the deterioration of the insulating film material formed on an ULSI. Therefore, the practical utilization is difficult. In recent years, particularly, the voltage delay of signal by the increase in electric resistance of the wiring and the increase in floating capacity of the insulating film is at stake, and an insulating film with low dielectric constant is increasingly directed. Since the heat resistance in many of such insulating films with low dielectric constant is as low as about 400° C., the treatment at the lowest temperature possible is desired, and the treatment at high temperature is a question.

Further, execution of the two thermal treatments under atmospheric pressure and high pressure itself naturally causes an increase in process and a rise of manufacturing cost, and it is preferred to reduce the number of processes from the viewpoint of the application to industrial production.

In the application of this invention, further, the material or forming method of the barrier layer, and a seed layer 2D imparted further thereon in plating are extremely important. Particularly, the affinity with copper has a great influence on the resistance reduction to plastic deformation in pressure filling or the promotion of migration of copper atom to the bottom parts of the hole part 2A and groove part 2C by diffusion. Those non-reactable with copper and highly affinitive with copper are ideally preferable, but it is the actual state that suitable ones can not be easily found. Of such materials, TiN, TaN, and CbN are particularly recommended. Since it is preferable in plating that the copper phase including the hole or groove inner part is finally oriented (111) to the substrate surface for the seed layer from the viewpoint of reduction in electric resistance and electromigration resistance, the use of sputtering which is regarded to facilitate the formation of such a selectively oriented seed layer is recommended.

When the entwining of electrolyte is serious in plating, it is adaptable to perform a thermal treatment under high-pressure gas atmosphere after performing a drying treatment under vacuum or atmospheric pressure at a temperature of 150° C. or lower where the crystal grain growth is not so much caused after plating, and at least moisture can be evaporated.

As the forming method of the barrier layer, PVD represented by sputtering and CVD utilizing chemical reaction are known. When the hole diameter is small as 0.2 $\mu$m or less, CVD is more advantageous to uniformly form the whole area including the side wall of the hole in a necessary and sufficient thickness. In this case, however, it is necessary to control the precipitating speed by diluting a gas forming the raw material, for example, $TCl_4+NH_3$ or $N_2$ with a gas called carrier such as Ar. It is feared that a peeling is caused when the adhesion of the barrier layer with the insulating film is insufficient and the extrusion phenomenon is dominant in the filling of the copper interconnect film by the high-pressure gas in the after process. The insufficient adhesion is caused by HCl generated by thermal decomposition and taken into the barrier film, or the coarsened film. In such a case, the improvement in density of the barrier film itself and the improvement in adhesion to the insulating film can be realized by performing a pressurizing treatment with a high-pressure gas at a high temperature prior to the formation of the copper interconnect film. The same temperature as in the high-pressure treatment of the copper interconnect film in the after process is sufficient for this treatment.

The followings are typical for the condition of the thermal treatment under high-pressure gas atmosphere and the atmospheric gas in the above illustration.

As the used gas, an inert gas such as Ar or nitrogen or a mixed gas thereof is recommended. Basically, any gas can be used without particular limitation if it can form an atmosphere never oxidizing or changing the quality of the Si substrate or interconnect film material. The higher the pressure is, the more effective filling function and promotion of surface diffusion are. However, the higher pressure as described above is not preferred from the viewpoint of economic property since the device becomes more complicated or more expensive, and the used gas quantity becomes larger. The effect mentioned in this invention can be revealed with a pressure of 30 MPa or more. From the viewpoint of the device price, a pressure of 200 MPa or less and, preferably, 120 MPa or less are recommended. Although the temperature of the thermal treatment depends on the pressure, and the effect can be provided even at a low temperature when the pressure is increased, a temperature of 350–470° C. is recommended within the above pressure range, and 300–380 ° C. is recommended in the combination with the hydrogen addition.

EXAMPLE

Some examples of this invention are described comparatively with some comparative examples in reference to Table 1.

Table 1 shows the result of experiments for the manufacture of an interconnect film by forming the interconnect film on a contact hole or interconnect groove by the Damascene formed on a Si wafer 200 mm in diameter by use of Cu and a Cu alloy as the interconnect film material, and then performing a pressure filling treatment by use of a high-pressure gas pressure. In the table, A.R. (Aspect Ratio) shows the ratio of depth to diameter of the contact hole. For the marks in the column of filling result, ⊙ shows that the contact holes were perfectly filled with the interconnect film material without leaving pores, × shows that pores were left, and Δ shows that a part of the contact holes was not filled at all, or the filling was not perfectly performed for a specified contact hole, leaving pores in the inner part thereof, which is not the state usable for production from the viewpoint of reliability.

Electroplating and plasma CVD (Ar carrier) using $Cu(hfac)_2$ as a source were used for filming, and the combination of the both was used for a part of filming. As the gas in the pressure filling, argon and nitrogen (Example 5) used in this kind of treatments were used. As the device, a hot isotropic pressing (HIP) device having a highest pressure of 200 MPa and a highest treatment temperature of 1000° C. was used.

In Example 1 and Comparative Examples 1-A to 1-C, a TiN barrier layer was formed in the order of 5–10 nm to a Si wafer having a contact hole with a diameter of 0.25 $\mu$m and A.R=4 formed thereon, and a pure copper interconnect film was formed in a thickness of 0.9 $\mu$m by electroplating, and then thermally treated. The diameter of the copper interconnect film grain was less than 0.1 $\mu$m, and the texture was particularly abundant in fine grains of 20–30 $\mu$m. The pressure in the thermal treatment was set to 100 MPa by argon in Example 1, to the atmospheric pressure in Comparative Examples 1-A and 1-B by, and to a high-pressure Ar gas atmosphere (pressure: 170 MPa) after the thermal treatment under atmospheric pressure in Comparative Example 1-C. In Comparative Example 1-B, the thermal treatment time under atmospheric pressure was extended to 60 minutes (1 hr) to promote the growth of the crystal grains. In Example 1, the holes could be filled with Cu without generating pores. The texture of copper in the pressure filled hole and the texture of the film on the surface consists of an assembly of crystals having grain sizes of 0.5–2 $\mu$m, or a polycrystal. Consequently, the electric resistance value was slightly high. In Comparative Examples 1-A and 1B, the textures were as shown in FIG. 1(b). Pores were included mainly near the bottom part within most of the holes although the crystal grain size of Comparative Example 1-B was slightly larger than that of Comparative Example 1-A. In Comparative Example 1-C where the interconnect film having the same texture as Comparative Example 1-A was subjected to the pressure filling treatment under high-pressure gas atmosphere, the filling of holes was insufficient regardless of a rather high pressure of 170 MPa although the holes was partially filled.

In Comparative Example 1-D, the current density in plating was reduced to grow large crystal grains (0.15 $\mu$m or more in average grain size) over a long time followed by annealing at 100 MPa and 400° C. In this case, generation of large crystal grains in the vicinity of the inlet of the hole was observed in some holes at the point of plating end, and as a result, a sufficient filling could not be realized even by the annealing under high pressure.

Example 2 and Comparative Example 2 are the applications to a groove 0.25 $\mu$m in width and 0.25 $\mu$m in depth. In Example 2 where the thermal treatment under high-pressure gas atmosphere was performed after film forming, the groove part was perfectly filled with copper by the so-called high-pressure reflow, and the smoothness of the surface was extremely satisfactory. On the other hand, in Comparative Example 2 where the thermal treatment under atmospheric pressure was performed, the upward opening was more extended, and 30% of the grooves were in imperfectly filled state.

Example 3 and Comparative Example 3 are the applications to a contact hole and interconnect groove by interconnect forming means of the so-called dual Damascene structure. In this case, the hole diameter of the contact hole formed in the bottom part of the groove is 0.25 $\mu$m, and the depth of the hole part is 0.7 $\mu$m. The copper interconnect film was imparted by a two-step film forming process, or by forming a fine copper layer on the bottom parts of the hole and groove by means of CVD (further increasing the filming speed after forming the seed layer) and then forming the interconnect film slightly thickly (2 $\mu$m) by electroplating.

In Example 3, it was confirmed that the filling process could be attained even in such a complicated structure. In Comparative Example 3, the contact holes were partially left in the state not filled at all.

In Example 4 and Comparative Example 4, the film forming was performed by CVD to a deep hole having a hole diameter of 0.15 $\mu$m and a depth of 1 $\mu$m, and the thermal treatment was performed under high-pressure gas atmosphere and atmospheric pressure. In Example 4, the contact holes were perfectly filled, while the filling could not be attained in Comparative Example 4.

In Example 5 and Comparative Example 5 wherein this invention was applied to a fine interconnect film structure of the dual Damascene structure having a 0.15-$\mu$m-in-diameter contact hole and a groove width of 0.25 $\mu$m, the thermal treatment was performed under a high-pressure N₂ gas atmosphere of 100 MPa in Example and under atmospheric pressure in Comparative Example after the copper interconnect film was formed by plating. For such fine holes, a substantially perfect filling was realized in Example 5 of this invention, while the filling was hardly performed in Comparative Example 5.

In Example 6 and Comparative Example 6, a film containing about 1% by weight of Sn was formed on a substrate having via holes with a pore diameter of 0.18 μm by the combination of Cu plating with Sn plating, and then annealed at 250° C. under high-pressure gas atmosphere and under atmospheric pressure. The electric resistance was slightly high in the both examples since an alloyed film was formed by this thermal treatment. The filling was insufficient in Comparative Example 6 where the annealing was performed under atmospheric pressure to the perfect filling in Example 6 of this invention.

By the application of this invention, a yield of 95% or more was ensured in Example 1 by the perfect filling extending over the substrate front surface. Compared with a yield of less than 40% in Comparative Example 1-A and about 50% in Comparative Example 1-B, it was proved that a high yield can be realized in this invention. This shows that this invention is an extremely promising technique in respect to quality ensuring in combination with the possibility of a significant reduction in cost in respect to industrial production.

Further, some examples of this invention were described comparatively with some comparative examples in reference to Table 2.

Table 2 shows the result of experiment for the manufacture of an interconnect film by forming the interconnect film on a contact hole or interconnect groove by the Damascene formed on a Si wafer 200 mm in diameter by use of Cu or Cu alloy as the interconnect film material, and then performing a pressure filling treatment by use of a high-pressure gas pressure. In the table, A.R. (Aspect Ratio) shows the ratio of depth to hole diameter of the contact hole. For the marks in the column of filling result, ⊚ shows that the contact holes were perfectly filled with the interconnect film material without leaving pores, × shows that pores were left, and Δ shows that a part of the contact holes was not filled at all, or the filling was not perfectly performed for a specified contact hole, leaving pores in the inner part thereof, which is not the state usable for production from the viewpoint of reliability.

A sputtering system was used for filling, and an HIP system with a highest pressure of 200 MPa and a highest treatment temperature of 1000° C was used as the pressure filling treatment device. As the gas in pressure filling, argon generally used in this kind of treatments was used. The hydrogen addition treatment after sputtering film deposition was executed by allowing the wafer to stand under pure hydrogen atmosphere for 5 hours at 1 ATM. and 100° C. The hydrogen quantity was about 4 wt %.

In Example 7 and Comparative Example 7-A to 7-D, a TiN barrier layer was imparted to a Si wafer having a contact hole with a diameter of 0.25 μm and A.R.=4 formed thereon in the order of 5–10 nm in the side wall part of the hole, and a copper interconnect film was formed in a thickness of about 1 μm by sputtering process followed by treatment. The diameter of the copper interconnect film grain was 0.1 μm or less, and the texture was abundant particularly in fine grains of 20–30 nm or less. The pressure in the thermal treatment was set to 100 MPa by argon in Example 1 and to 100 or 200 MPa in Comparative Examples 7-A to 7-B. In Example 7, the holes could be filled with Cu without generating pores. The texture of copper filled hole and the texture of the film on the surface in the pressure were substantially in monocrystal state, when observed around the part of the hole, with a grain size grown up to 1–3 μm. Consequently, the electric resistance value was slightly increased. In Comparative Example 7-A where only the film deposition temperature in sputtering was set higher than that of Example7, the crystal grain size of the copper interconnect film after sputtering film deposition was considerably grown up already as 0.3–0.7 μm, and no hole filled to the bottom part was observed even by performing a high pressure treatment under the same condition as in Example 1.

In Example 7-B where the same sample as Comparative Example 7-A was used, and both the temperature and pressure in the high pressure treatment were raised, the perfect filling could not be attained even under the condition of 200 MPa and 425° C. because the copper crystal grains were grown up already. In Comparative Example 7-C, the same sample as Comparative Example 7-B was used, and the holding time was extended to 60 minutes with the same high-pressure treatment pressure and temperature. The filling was imperfect regardless of the effort of extending the time to satisfactorily promote the diffusion. In Comparative Example 7-D, the thermal treatment was performed not under high pressure but under atmospheric pressure at the same temperature for the same time after the copper interconnect film was formed by sputtering at room temperature in the same manner as Example 7. The filling of the holes was not attained although the crystal grain size of the copper interconnect film after this thermal treatment was grown up to 0.3–1 μm.

Example 8 and Comparative Example 8 were the applications to a contact hole and interconnect groove by interconnect forming means of the so-called dual Damascene structure. The hole diameter of the contact hole formed on the bottom surface of the groove was 0.25 μm, and the depth was 0.5 μm. The copper interconnect film was formed slightly thickly (2 μm) by sputtering at room temperature.

In Example 8, it was confirmed that even those having such a complicated structure could be filled. In Comparative Example 8, a part of the contact holes was left in the state not filled at all.

In Example 9 and Comparative Examples 9-A and 9-B, a TiN barrier layer was formed by means of CVD to a deep hole with a hole diameter of 0.15 μm and a depth of 1 μm, a high pressure treatment of 350° C. and 100 MPa was performed, and then a copper interconnect film was formed in a thickness of about 0.9 μm by sputtering, and thermally treated under high-pressure gas atmosphere and under atmospheric pressure. The temperature in the sputtering was set to 300° C. in Comparative Example 9-A and to room temperature in Comparative Example 9-B, wherein no high pressure treatment was performed after the formation of the TiN barrier layer. In Example 9, the contact holes were perfectly filled, the TiN barrier layer was firmly adhered to the insulating layer, and the barrier characteristic of the barrier material after film forming was superior. On the other hand, the filling itself was not attained in Comparative Example 9-A. Further, in Comparative Example 9-B, the filling was attained, but a problem arose such as the peeling of the interconnect film in the barrier layer part in the working of a Scanning Electron Microscopy (SEM) observation sample. It was estimated that the barrier film was peeled or deteriorated in the filling by the high pressure treatment, and the barrier property was poor.

In Example 10 and Comparative Example 10, the effect of hydrogen addition by this invention to a fine interconnect film structure of the dual Damascene structure with a 0.15-μm-in-diameter contact hole and a groove width of 0.4 μm was comparatively examined. In Example 10 where the hydrogen addition was performed, it was confirmed that the filling and the crystal grain growth can be performed at 100 MPa and a low temperature of 300° C. On the other hand, it was about half the number that could be filled under the same temperature and pressure condition as in Example 10 of those having no addition of hydrogen.

From the above experiments, it was extremely cleared that whether the hole or groove can be sufficiently filled with a copper interconnect material by a high pressure gas treatment or not largely depends on the size of the crystal grain constituting the copper interconnect film after sputtering to the diameter of the hole, and that the presence of hydrogen in the copper interconnect film has a significant influence. Namely, it was verified that it is basically important first that temperature of semiconductor substrate is kept low in sputtering process, as the condition of sputtering, to make the crystal grain constituting the copper wring film just after film deposition as fine as possible, and it is further important to add hydrogen to the copper interconnect film in order to promote the filling or the crystal grain growth to perform the treatment at a lower temperature and a lower pressure.

By the application of this invention, a yield of 95% or more was ensured in Example 7 by the perfect filling extending over the whole substrate surface. Compared with yields of less than 40% in Comparative Examples 7-A and 7-B and about 50% in Comparative Example 7-C, it was proved that a high yield could be realized in this invention. This shows that this invention is an extremely useful technique in respect to quality ensuring in combination with the possibility of a significant reduction in cost in respect to industrial production.

According to this invention, as described above, it was verified that the lower electric resistance of an interconnect film which is becoming a serious subject in the manufacture of an ULSI semiconductor whose fining and multilayering will be increasingly promoted in the future can be attained, and the manufacture of a copper alloy interconnect film to which attention has increasingly been paid, particularly, in terms of lower electric resistance and EM resistance can be realized by any one of plating, CVD and PVD in combination with a pressure filling technique by gas pressure, so that the improvement effect of yield naturally possessed by the pressure filling treatment can be enjoyed. In the manufacture of the interconnect film by a copper interconnect film forming plating device whose spread is predicted in the future, an ULSI having an interconnect film including the finer holes or grooves can be realized with high reliability and high yield, and the application to industrial production can be extremely facilitated, including the viewpoint of treatment cost. Thus, contributions of this invention to the future development of the ULSI industry are really great.

TABLE 1

| | Dimension of Hole or Groove | | | | | Film Forming Condition | | | High-pressure Treatment Condition | | | | Stored Natural | |
| --- | --- | --- | --- | --- | --- | --- | --- | --- | --- | --- | --- | --- | --- | --- |
| | Hole Dia. (μm) | Groove Width (μm) | Total Depth (μm) | A.R. | Freq. | Filming Method | Film Thickness (nm) | Film Material | Pressure (MPa) | Temp (° C.) | Time (min) | Treatment Result | Resistance μΩcm | Remarks |
| Ex. 1 | 0.25 | Non | 1 | 4 | 1 | Electro-plating | 0.9 | Cu (99.99%) | 100 | 400 | 5 | ⊚ | ~1.8 | 1) |
| Ex. 2 | Non | 0.25 | 0.25 | 1 | 1 | Electro-plating | 0.6 | Cu (99.99%) | 100 | 450 | 5 | ⊚ | ~1.8 | |
| Ex. 3 | 0.25 | 0.4 | 0.7 | 2.8 | 2 | CVD (hole part) Electro-plating (groove) | 1.5 | Cu (99.99%) | 70 (N$_2$) | 380 | 5 | ⊚ | −1.8 ~1.8 | |
| Ex. 4 | 0.15 | Non | 1 | 6.7 | 1 | CVD | 1 | Cu (99.99%) | 100 (N$_2$) | 350 | 5 | ⊚ | ~1.9 | |
| Ex. 5 | 0.15 | 0.25 | 1 | 6.7 | 1 | Electro-plating | 1 | Cu (99.99%) | 100 (N$_2$) | 380 | 5 | ⊚ | ~1.8 | |
| Ex. 6 | 0.25 | Non | 1 | 4 | 1 | Electro-plating | 1 | Cu-1% Zn | 100 | 250 | 15 | ⊚ | ~20 | |
| C. Ex. 1-A | 0.25 | Non | 1 | 4 | 1 | Electro-plating | 0.9 | Cu (99.99%) | Atm. press | 400 | 5 | x | | |
| C. Ex. 1-B | 0.25 | Non | 1 | 4 | 1 | Electro-plating | 0.9 | Cu (99.99%) | Atm. press | 400 | 60 | x | | |
| C. Ex. 1-C | 0.25 | Non | 1 | 4 | 1 | Electro-plating | 0.9 | Cu (99.99%) | Atm. press 170 | 400 400 | 5 | Δ | 2.3 | 2) |
| C. Ex. 1-D | 0.25 | Non | 1 | 4 | 1 | Electro-plating | 0.9 | Cu (99.100%) | Atm. press | 400 | 5 | x | | 3) |
| C. Ex. 2 | Non | 0.25 | 0.25 | 1 | 1 | Electro-plating | 0.6 | Cu (99.99%) | Atm. press | 450 | 5 | x | | |
| C. Ex. 3 | 0.25 | 0.4 | 0.7 | 2.8 | 2 | CVD (hole part) Electro-plating (groove) | 1.5 | Cu (99.99%) | Atm. press | 380 | 5 | x | | |
| C. Ex. 4 | 0.15 | Non | 1 | 6.7 | 1 | CVD | 1.5 | Cu (99.99%) | Atm. press | 350 | 5 | x | | |
| C. Ex. | 0.15 | 0.25 | 1 | 6.7 | 1 | Electro- | 1 | Cu | Atm. | 380 | 5 | x | | |

TABLE 1-continued

| | Dimension of Hole or Groove | | | | | Film Forming Condition | | | High-pressure Treatment Condition | | | | Stored Natural | |
|---|---|---|---|---|---|---|---|---|---|---|---|---|---|---|
| | Hole Dia. (μm) | Groove Width (μm) | Total Depth (μm) | A.R. | Freq. | Filming Method | Film Thickness (nm) | Film Material | Pressure (MPa) | Temp (° C.) | Time (min) | Treatment Result | Resistance μΩcm | Remarks |
| 5 | | | | | | plating | | (99.99%) | Press (N₂) | | | | | |
| C. Ex. 6 | 0.25 | Non | 1 | 4 | 1 | Electro-plating | 1 | Cu-1% Zn | Atm. press | 250 | 15 | x | | |

1) Filling effect was confirmed extending over the whole substrate surface. Yield: 95% or more; Grain size: 1 μm or less
2) Those in sufficient filled state were about half the number.
3) Grain size after plating: 0.25 μm or less

TABLE 2

| | Dimension of Hole or Groove | | | | Sputtering Filming Condition | | | | High-pressure Treatment Condition | | | | Stored Natural | |
|---|---|---|---|---|---|---|---|---|---|---|---|---|---|---|
| | Hole Dia. (μm) | Groove Width (μm) | Total Depth (μm) | A.R. | Barrier Layer | Temp. | Film Thickness (nm) | H₂ Addition | Press (MPa) | Temp (° C.) | Time (min) | Treatment Result | Resistance μΩcm | Remarks |
| Ex. 7 | 0.25 | Non | 1 | 4 | TiN (CVD) | r.t. | 0.9 | Non | 100 | 380 | 5 | ⊙ | ~1.8 | 1) |
| Ex. 8 | 0.25 | 0.4 | 0.7 | 2.8 | TiN (CVD) | r.t. | 1.5 | Non | 100 | 380 | 5 | ⊙ | ~1.8 | |
| Ex. 9 | 0.15 | Non | 1 | 6.7 | High-pressure treatment after TiN filming | 0° C. | 1 | Non | 100 | 350 | 5 | ⊙ | ~1.8 | |
| Ex. 10 | 0.18 | Non | 1.2 | 6.7 | TaN (PVD) | 0° C. | 1 | Added | 100 | 300 | 5 | ⊙ | ~1.8 | |
| C. Ex. 7-A | 0.25 | Non | 1 | 4 | TiN (CVD) | 300° C. | 0.9 | Non | 100 | 380 | 5 | X | | |
| C. Ex. 7-B | 0.25 | Non | 1 | 4 | TiN (CVD) | 300° C. | 0.9 | Non | 200 | 425 | 5 | X | | |
| C. Ex. 7-C | 0.25 | Non | 1 | 4 | TiN (CVD) | 300° C. | 0.9 | Non | 200 | 425 | 60 | Δ | 2.3 | 2) |
| C. Ex. 1-D | 0.25 | Non | 1 | 4 | TiN (CVD) | r.t. | 0.9 | Non | Atm. press | 380 | 5 | X | | 3) |
| C. Ex. 8 | 0.25 | 0.4 | 0.7 | 2.8 | TiN (CVD) | r.t. | 1.5 | Non | Atm. press | 350 | 5 | X | | 4) |
| C. Ex. 9-A | 0.15 | Non | 1 | 6.7 | TiN (CVD) | 300° C. | 1.5 | Non | 200 | 350 | 5 | X | | 5) |
| C. Ex. 9-B | 0.15 | Non | 1 | 6.7 | TiN (CVD) | 0° C. | 1.5 | Non | 200 | 350 | 5 | X | | 6) |
| C. Ex. 10 | 0.18 | Non | 1.2 | 6.7 | TaN (CVD) | 0° C. | 1 | Non | 100 | 300 | 5 | X | | |

1) Grain size after sputtering: 0.1 μm or less; Crystal grain size after high pressure treatment: 1–3 μm; Filling effect was confirmed over the whole substrate surface; Yield: 95% or more.
2) Those in sufficiently filled state were about half the number.
3) Grain size after sputtering: 0.1 μm or less; Crystal grain size after atmospheric annealing: 0.3–1 μm; No filling effect was observed.
4) The same as above.
5) Filling was impossible.
6) Peeling of barrier film was observed although the filling was substantially perfect. The interconnect film was peeled from the insulating layer in the barrier layer part in the formation of a SEM observation sample. Those in sufficiently filled state were About half the number.

What is claimed is:

1. A method of forming an interconnect film of a metallic material consisting of copper or copper alloy on a substrate which has an insulating film thereon, the insulating film having at least one hole or groove formed thereon, the method comprising:

forming a barrier layer which covers a surface of the insulating film and an inner surface of the hole or groove;

precipitating crystal grains having an average crystal grain size of 0.1 μm or less of the metallic material on the barrier layer or a seed layer formed on the barrier layer; and heating the substrate on which the metallic material crystal grains are precipitated under a high-pressure gas atmosphere to grow the metallic material crystal grains while suppressing generation of pores among the grains, thereby obtaining a substantially pore-free film of the metallic material filling the hole or groove and covering the whole substrate surface.

2. The method of forming an interconnect film according to claim 1, wherein the heating is performed at a temperature of 350 to 470° C. under the high-pressure gas atmosphere.

3. The method of forming an interconnect film according to claim 2, wherein the heating is performed under the high-pressure gas atmosphere of 30 MPa to 200 MPa.

4. The method of forming an interconnect film according to claim 2, wherein the heating is performed under the high-pressure gas atmosphere of 30 MPa to 120 MPa.

5. The method of forming an interconnect film according to claim 1, wherein the seed layer is formed on the barrier layer by CVD or sputtering, and the crystal grains of the metallic material are precipitated on the surface of the seed layer by means of electroplating.

6. The method of forming an interconnect film according to claim 5, wherein the heating is performed at a temperature of 350 to 470° C. under the high-pressure gas atmosphere of 30 MPa to 200 MPa.

7. The method of forming an interconnect film according to claim 1, wherein the metallic material crystal grains are precipitated by plating or CVD.

8. The method of forming an interconnect film according to claim 1, wherein the metallic material crystal grains are precipitated by PVD.

9. The method of forming an interconnect film according to claim 1, wherein the barrier layer is formed by CVD or PVD and then the substrate on which the barrier layer is formed is exposed under a high-temperature, high-pressure gas atmosphere to closely fit the barrier layer to the insulating film.

10. The method of forming an interconnect film according to claim 1, additionally comprising adding hydrogen to the metallic material crystal grains before heating the substrate on which the metallic material crystal grains are precipitated.

11. The method of forming an interconnect film according to claim 10, wherein the heating is performed at a temperature of 300 to 380° C.

* * * * *